United States Patent [19]

Schultz et al.

[11] Patent Number: 4,562,454
[45] Date of Patent: Dec. 31, 1985

[54] ELECTRONIC FUSE FOR SEMICONDUCTOR DEVICES

[75] Inventors: Warren J. Schultz, Tempe; Herbert A. Saladin, Mesa, both of Ariz.

[73] Assignee: Motorola, Inc., Schaumburg, Ill.

[21] Appl. No.: 566,766

[22] Filed: Dec. 29, 1983

[51] Int. Cl.⁴ .................. H01L 27/02; H01L 9/02; H02H 9/00

[52] U.S. Cl. ....................... 357/51; 361/57; 307/200 A

[58] Field of Search ............... 357/51; 361/57; 307/200 A

[56] References Cited

U.S. PATENT DOCUMENTS 4,024,417  5/1977  Heuber et al. ............... 357/51 X
4,363,064  12/1982  Billings ........................... 361/57

FOREIGN PATENT DOCUMENTS 2092377  9/1982  United Kingdom ............... 357/51

Primary Examiner—Martin H. Edlow
Assistant Examiner—Terri M. Henn
Attorney, Agent, or Firm—Michael D. Bingham

[57] ABSTRACT

A semiconductor fuse is disclosed that provides protection against both overcurrent and the abrupt application of a voltage to semiconductor devices. A first means is coupled to an input terminal for providing a signal when a current is applied to the input terminal. A second means is coupled between the input terminal and an output terminal for allowing current to pass therebetween and is coupled to the detecting means and responsive to the signal. A third means is coupled between the output terminal and a ground terminal for shorting a current therebetween. A fourth means is coupled to the input terminal, the second means, and the third means for activating the third means and preventing the second means from responding to the signal when the input current exceeds a predetermined value.

20 Claims, 2 Drawing Figures

ELECTRONIC FUSE FOR SEMICONDUCTOR DEVICES

BACKGROUND OF THE INVENTION

1. Field of the Invention

This invention relates generally to fuses and, more particularly, to a circuit fabricated in monolithic integrated circuit form that provides protection against both overcurrent and the abrupt application of a voltage to semiconductor devices.

2. Background Art

Electronic circuits are subject to stresses that may damage the semiconductor devices contained therein. These stresses include overvoltage, overcurrent, overtemperature, and the abrupt application of a voltage (hard start). Known overvoltage and overtemperature protection circuits provide varying degrees of protection for their specific areas of concern. However, fuses that protect against overcurrent have historically comprised a material coupled between the power source and circuit that "blows open" when the current exceeds a predetermined amount. This type of fuse is insufficient to protect most semiconductor circuits due to the slow reaction time for the material to "blow open". The semiconductor devices to be protected could be damaged prior to the fuse "blowing".

Thus, a need exists for a fuse capable of being monolithically integrated for providing protection against overcurrent and the abrupt application of a voltage.

SUMMARY OF THE INVENTION

Accordingly it is an object of the present invention to provide an improved fuse.

Another object of the present invention is to provide a semiconductor fuse having a quick reaction time.

Still another object of the present invention is to provide a semiconductor fuse that will protect against abrupt applications of voltage.

In carrying out the above and other objects of the present invention in one form, there is provided a semiconductor fuse having an input terminal, an output terminal, and a supply voltage terminal. A means is coupled to the input terminal for detecting when a current is applied thereto and for providing a signal. A second means is coupled between the input terminal and the output terminal and to the first means and is responsive to the signal for allowing current to pass between the input terminal and the output terminal. A third means is coupled between the output terminal and the supply voltage terminal for shorting a current therebetween. A fourth means is coupled to the input terminal, the second means, and the third means for activating the third means and preventing the second means from responding to the signal when the current exceeds a predetermined value.

The above and other objects, features, and advantages of the present invention will be better understood from the following detailed description taken in conjunction with the accompanying drawing.

DETAILED DESCRIPTION OF THE PREFERRED EMBODIMENT

Figure 1:
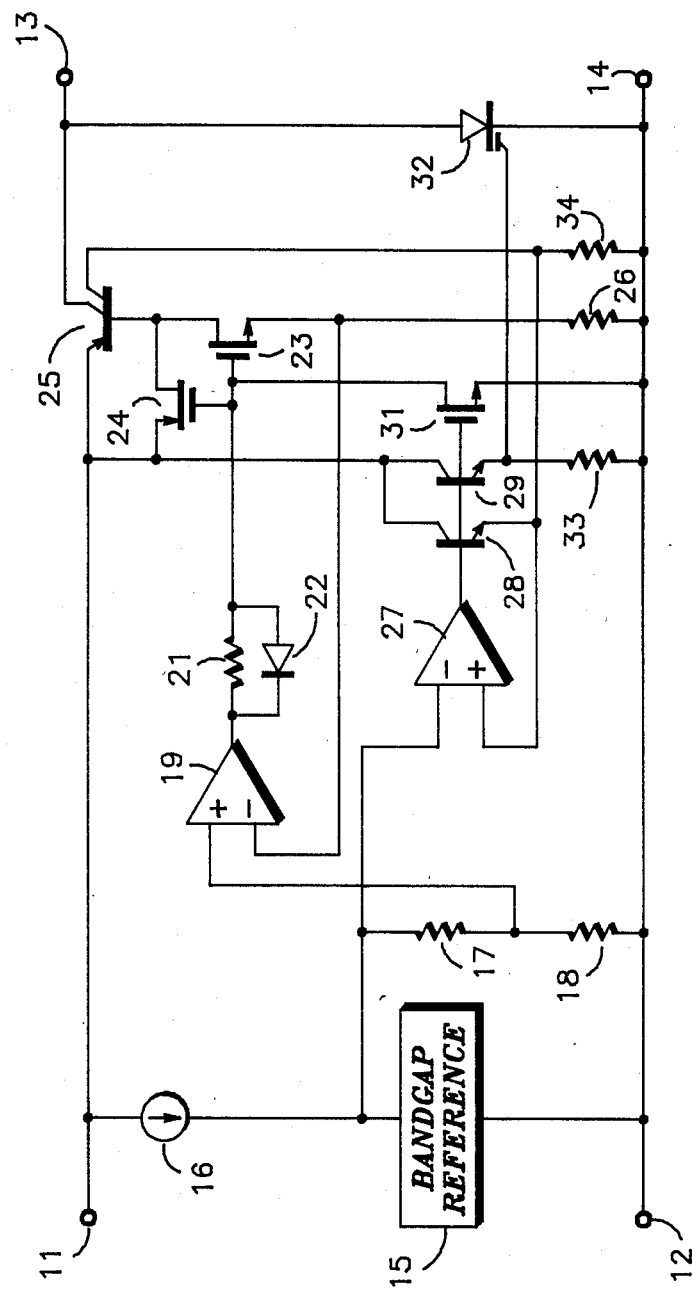
FIG. 1 illustrates in schematic form the preferred embodiment of the present invention.

Referring to FIG. 1, the semiconductor fuse of the present invention includes input terminals 11, 12 and output terminals, 13, 14. An input voltage is applied to terminals 11, 12 and a load is coupled between terminals 13, 14. Terminals 12, 14 are at the same voltage level, which typically may be ground. Band-gap reference 15 has one side connected to terminal 12 and the other side coupled to terminal 11 by current source 16. Bandgap reference 15 is shown in block form and comprises typical circuitry for providing reference voltages in a manner known to those skilled in the art. Voltage divider resistors 17, 18 are connected in parallel with bandgap reference 15 between current source 16 and terminal 12. A noninverting terminal of operational amplifier 19 is connected between resistors 17, 18 for receiving a reference voltage therefrom. An output terminal of operational amplifier 19 is connected to one terminal of resistor 21 and the cathode of diode 22. The other side of resistor 21 and the anode of diode 22 are connected to the gates of MOS transistors 23, 24. The drains of transistors 23, 24 are connected to the base of PNP pass transistor 25 and the source of transistor 23 is coupled to terminal 12 by resistor 26 and connected to the inverting input of operational amplifier 19. Transistor 25 has its emitter connected to terminal 11 and a first collector connected to terminal 13 and serves as a gate for the passage of current from the input voltage applied to terminal 11, 12 to the load coupled between terminals 13, 14.

Operational amplifier 19 provides the base current for transistor 25 through transistor 23 by measuring the voltage at the source of transistor 23 and comparing it with the voltage from voltage divider resistors 17, 18 and bandgap reference 15. Thus, the base current supplied to transistor 25, is regulated independent of the input voltage applied to terminals 11, 12.

Comparator 27 has its inverting input coupled to terminal 12 by bandgap reference 15 and its output terminal connected to the bases of NPN transistors 28, 29 and the gate of N-channel transistor 31. The collectors of transistors 28, 29 are both connected to the source of transistor 24 and terminal 11. The emitter of transistor 28 is connected to the non-inverting input of comparator 27 and the emitter of transistor 29 is connected to the gate of silicon controlled rectifier 32 and coupled to terminal 12 by resistor 33. The drain of transistor 31 is coupled to the output of operational amplifier 19 by the parallel combination of resistor 21 and diode 22, and the source of transistor 31 is connected to terminal 12. Resistor 34 is coupled between terminal 12 and both a second collector of transistor 25 and the noninverting input of comparator 27. The two collectors of transistor 25 comprise a combination of vertical and lateral PNP transistors, which will be discussed in greater detail hereinafter. Silicon controlled rectifier (SCR) 32 has its anode connected to terminal 13 and its cathode connected to terminal 12 for shorting the voltage thereacross when triggered.

Bandgap reference 15, current source 16, and resistors 17, 18 provide reference voltages for the circuit. Operational amplifier 19, resistors 21, 26, diode 22 and transistor 23 provide the soft start feature, or non-abrupt application of a voltage, of the present invention and comparator 27, transistors 24, 28, 29, 31, resistors 33, 34 and silicon controlled rectifier 32 provide the overcurrent feature.

If a rapidly rising voltage is applied to terminals 11, 12, operational amplifier 19 provides its output to the gate of transistor 23, rendering both transistors 23, 25 conductive, thereby allowing current to flow through transistor 25 to the load. However, due to the time constant of the gate capacitance of transistor 23 and resistor 21, the base current of transistor 25 ramps up relatively slowly (typically about 100 microseconds), thereby providing soft start protection against failure due to rapid initial application of an input voltage.

If a load attempts to draw a current above a predetermined current threshold, pass transistor 25 will cease conducting and silicon controlled rectifier 32 will short out the voltage as follows. The current from the second collector of transistor 25 is supplied as a voltage at resistor 34 to the noninverting input of comparator 27. When the voltage on the noninverting input of comparator 27 exceeds the voltage on the inverting input from bandgap reference 15, an output is provided that turns on transistor 31, thereby removing gate voltage from transistor 23. When transistor 23 turns off, transistor 25 will also be turned off, thereby eliminating the current path to terminal 13, e.g., the fuse is "opened". Transistor 29 is also turned on by the output of comparator 27, which triggers silicon controlled rectifier 32 simultaneously shorting terminal 13 to terminal 14. When transistor 31 conducts, it will enable transistor 24, which will apply the voltage on terminal 11 to the base of transistor 25. Thus, the off state of transistor 25 is further insured.

Transistor 28 provides a latching mechanism to prevent oscillations and higher power dissipation by maintaining the fuse in the open state until power is removed and reapplied. Transistor 28 is turned on by the output of comparator 27 forming a regenerative path which latches the output comparator 27 high, thereby keeping transistor 25 off and silicon controlled rectifier 32 triggered until the power is removed from terminals 11, 12.

Figure 2:
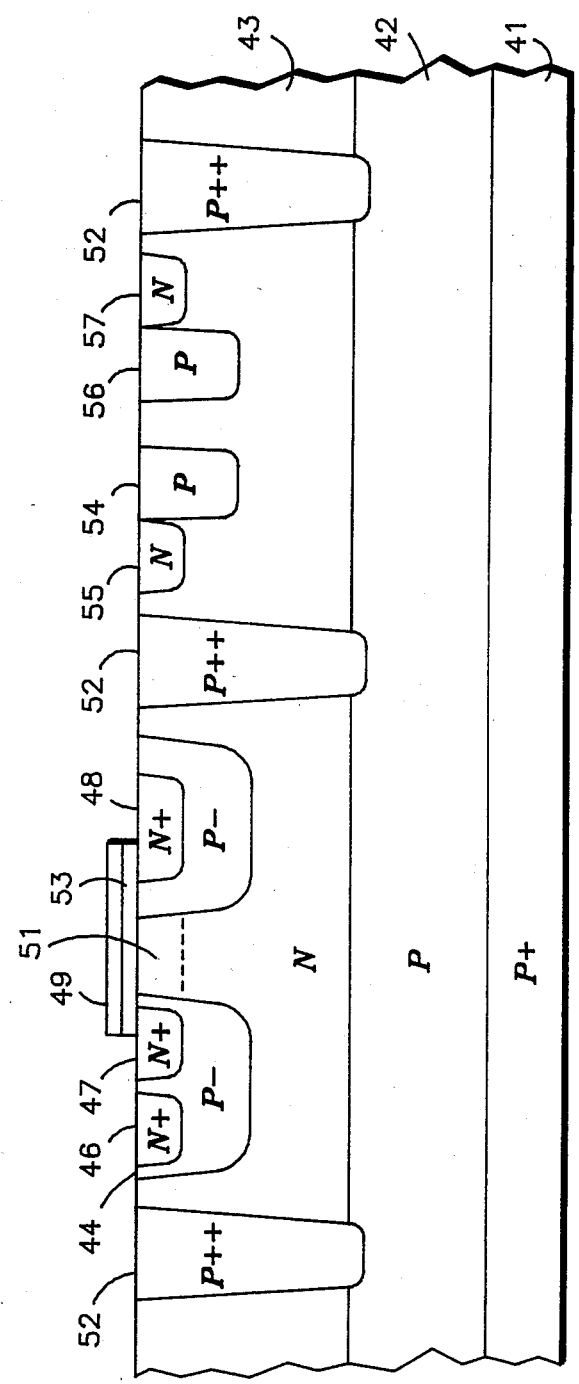
FIG. 2 illustrates in cross-section a bipolar PNP transistor and silicon controlled rectifier embodied in the present invention.

The semiconductor fuse just described includes both a PNP transistor 25 that acts as a series switch for the current and a silicon controlled rectifier 32 to rapidly clamp the output voltage to ground. PNP transistor 25 must carry the entire load current while silicon controlled rectifier 32 must shunt the stored charge in the load coupled between terminals 13, 14. This is accomplished by using both a fully integrated combination of a vertical PNPN silicon controlled rectifier and a vertical PNP transistor as illustrated in FIG. 2. The PNPN structure is fabricated utilizing a process based on a conventional power transistor process and includes a heavily doped P-type single crystal bulk silicon material 41 serving as a substrate. Overlying bulk material 41 is grown an epitaxial layer 42. The epitaxial layer 42 is P-doped and has a higher resistivity than does the bulk region 41. Epitaxial layer 42 has a thickness and doping to achieve the breakdown voltage characteristics desired for the PNPN device. Epitaxial layer 42 and bulk region 41 formed the anode of the silicon controlled rectifier. Overlying the anode is grown an N-type epitaxial layer 43. Lightly doped P-type regions 44, 45 are diffused in N-type epitaxial layer 43. N+ regions 46, 47 are diffused into P-region 44 and serve as the source of an MOS transistor incorporated in the silicon controlled rectifier 32. N+ region 48 is diffused into P region 45 and serves as the cathode for the rectifier. A polysilicon layer 49 partially overlies N+ regions 47, 48, P regions 44, 45 and N layer 43 and serves as a gate for the MOS transistor. N layer 43 is the drain of the MOS transistor. A P-type area 51 is diffused into N-type region 43 for decreasing a resistance in a path between P regions 44, 45. Diffused isolations 52 extend through N layer 43 and into the underlying P layer 42. For clarity, insulating layers, metal layers and the like have not been illustrated. A metal layer interconnects, e.g., shorts out, N+ regions 46, 47, 48 and P-type region 44. The polysilicon layer 49 is isolated by a surrounding layer 53 of oxide from the metal and regions 43, 44, 45, 47, 48.

The thyristor comprises the vertical structure including N+ region 48, P region 45, N layer 43, P layer 42 and P substrate 41. When a positive voltage is placed on P substrate 41 (anode) with respect to N+ region 48 (cathode), no current flows due to the reverse bias junction between N layer 43 and P region 45; therefore, the silicon controlled rectifier is in the off stage. When an additional positive voltage is placed on polysilicon gate 49 with respect to N+ region 48, a shallow channel of P-type material in region 45 is inverted to N-type. A conduction path now exists from P+ substrate 41 across a forward bias junction to N layer 43 through an N-type channel at P region 45 to N+ region 48. Once current begins to flow across the boundary between P+ substrate 41 and N layer 43, regeneration and latching occur in the four layer structure comprised of P+ substrate 41, P-layer 42, N layer 43, P region 45 and N+ region 48 in a manner known to those skilled in the art.

The structure of PNP transistor 25 includes P substrate 41, P layer 42, and N layer 43 as previously described. Epitaxial layer 42 and bulk material 41 form the collector of the power PNP transistor 25. A high doped P type region 54 is diffused into epitaxial layer 43 and serves as the emitter. An N-type base contact 55 is diffused into epitaxial layer 43 and adjacent to region 54. A P-type region 56 is diffused into N epitaxial layer 43 and serves as the second collector of transistor 25. An N-type base contact region 57 is diffused into epitaxial layer 43 and adjacent to region 56. P region 54 serves as the emitter of transistor 25 connected to output terminal 13 and comprises the emitter of a vertical PNP power transistor since current flows vertically through the device with a collector on one surface of the device and the emitter and base on the opposite side of the device. This device is optimized for high current capability and low saturation voltage. The current flowing through the device flows through the heavily doped, low resistant bulk region 42. The desired voltage characteristics is determined in large part by the thickness and doping of the epitaxial layers 41, 42.

P region 56, or the collector of transistor 25 coupled to terminal 12 by resistor 34, is the collector of a lateral PNP transistor comprising P region 54, N layer 43, and P region 56. This lateral PNP transistor will draw a substantially smaller amount of current than the vertical transistor for sampling the current to output terminal 13. Both the vertical PNP transistor and the lateral PNP transistor are isolated from the remaining chip by diffused isolations 52 which extend through the N-type epitaxial layer 43 and into the underlying epitaxial layer 42. Alternate isolation techniques, i.e., a groove etched through the thickness of the N-type epitaxial layer 43, may be used.

For clarity, insulating layers, metal interconnects, and the like have not been shown in FIG. 2. These layers and interconnects are formed as in any conventional semiconductor structure. Similarly, the PNP transistor and PNPN rectifier have been shown only schematically having simple collector, base, and emitter regions. The structure and practice will be of cellular or other geometry to optimize the particular required characteristics.

Although the transistors shown in FIG. 2 are bipolar, MOS transistors may be utilized as well.

By now it should be appreciated that there has been provided a semiconductor fuse that provides a quick reacting over current protection along with a soft start capability.

We claim:

1. An electronic fuse including an input terminal, an output terminal, and a supply voltage terminal, comprising:
    input means coupled to said input terminal for providing a signal when current is applied to said input terminal;
    gate means comprising a PNP transistor having an emitter coupled to said input terminal, a first collector coupled to said output terminal, and a base responsive to said signal for allowing current to pass between said input terminal and said output terminal;
    shorting means coupled between said output terminal and said supply voltage terminal for shorting current therebetween; and
    triggering means coupled to said input terminal, said gate means and said shorting means for triggering said shorting means and preventing said gate means from responding to said signal when said current exceeds a predetermined value.

2. The fuse according to claim 1 wherein the structure of said PNP transistor comprises:
    a substrate of a first conductivity type forming said first collector;
    a first region having a second conductivity type formed at a surface of said substrate;
    a second region having said first conductivity type formed at a surface of and within a first portion of said first region and forming said emitter; and
    a third region having said second conductivity type formed at a surface of and within a second portion of said first region and forming said base.

3. The fuse according to claim 1 wherein said PNP transistor further comprises a second collector coupled to said triggering means.

4. The fuse according to claim 3 wherein the structure of said PNP transistor comprises:
    a substrate of a first conductivity type forming said first collector of said PNP transistor;
    a first region having a second conductivity type formed at a surface of said substrate;
    a second region having said first conductivity type formed at a surface of and within a first portion of said first region and forming said emitter;
    a third region having said first conductivity type formed at a surface of and within a second portion of said first region and forming said second collector; and
    a fourth region having said second conductivity type formed at a surface of and within a third portion of said first region and forming said base.

5. The fuse according to claim 4 wherein said substrate comprises a heavily doped bulk portion and a more lightly doped epitaxial layer grown on said bulk portion.

6. The fuse according to claim 5 wherein said first region comprises an epitaxial layer grown on said more lightly doped epitaxial layer.

7. The fuse according to claim 4 wherein said first conductivity type is P-type and said second conductivity type is N-type.

8. The fuse according to claim 4 wherein the structure of said PNP transistor further comprises means for electrically isolating said first, second and third portions of said first region.

9. The fuse according to claim 1 wherein said shorting means comprises a vertical thyristor having an anode coupled to said output terminal, a cathode coupled to said supply voltage terminal, and a gate coupled to said triggering means.

10. The fuse according to claim 9 wherein said vertical thyristor has a structure comprising:
    a substrate of a first conductivity type forming an anode of said output thyristor;
    a first region having a second conductivity type formed at a surface of said substrate;
    a second region having said first conductivity type formed at a surface of and within a first portion of said first region;
    a third region having said second conductivity type formed at a surface of and within a portion of said second region and forming a cathode of said output thyristor;
    a fourth region having said second conductivity type formed at a surface of and within a second portion of said first region and forming a gate of said output thyristor; and
    means for electrically isolating said first and second portions of said first region.

11. The fuse according to claim 9 wherein said vertical thyristor has a structure comprising:
    a substrate of a first conductivity type forming a cathode of said output thyristor;
    a first region having a second conductivity type formed at a surface of said substrate;
    a second region having said first conductivity type formed at a surface of said first region;
    a third region having said second conductivity type formed at a surface of and within a portion of said second region and forming an anode of said output thyrfstor;
    a fourth region having said first conductivity type formed at a surface of and within a second portion of said second region and forming a gate of said output thyristor; and
    means for electrically isolating said first and second portions of said second region.

12. The fuse according to claim 9 wherein said vertical thyristor has a structure comprising:
    a substrate of a first conductivity type forming an anode of said output thyristor;
    a first region having a second conductivity type formed at a surface of said substrate;
    a second region having said first conductivity type formed at a surface of and within a first portion of said first region;
    a third region having said second conductivity type formed at a surface of and within a portion of said second region and forming a cathode of said output thyristor;
    a fourth region having said first conductivity type formed at a surface of and within a second portion of said first region;

a fifth region having said second conductivity type formed at a surface of and within said fourth region and forming a source of an MOS transistor;

a polysilicon layer overlying a portion of said first region, said second region, said third region, said fourth region, and said fifth region and forming a gate of said MOS transistor, said MOS transistor for triggering said output thyristor; and means for electrically isolating said first and second portions of said first region.

13. The structure of claim 10 wherein said substrate comprises a heavily doped bulk portion and a more lightly doped epitaxial layer grown on said bulk portion.

14. The structure of claim 10 wherein said first conductivity type is P-type and said second conductivity type is N-type.

15. The structure of claim 11 wherein said first conductivity type is N-type and said second conductivity type is P-type.

16. The structure of claim 12 wherein said first conductivity type is P-type and said second conductivity type is N-type.

17. An electronic fuse having an input terminal, an output terminal, and a supply voltage terminal, for providing protection against overcurrent between said input terminal and said output terminal, and protection against the abrupt application of voltage between said input terminal and said supply voltage terminal, comprising:

a pass transistor coupled between said input terminal and said output terminal and responsive to a signal;

a thyristor coupled between said output terminal and said supply voltage terminal for shorting current therebetween when triggered;

means coupled to said pass transistor for generating said signal when the voltage is applied to said input terminal; and means coupled to said pass transistor and said thyristor, for triggering said thyristor when a voltage determined by a current through said pass transistor is greater than a reference voltage.

18. The fuse according to claim 17 wherein said pass transistor comprises a vertical PNP transistor.

19. The fuse according to claim 17 wherein said thyristor comprises a vertical structure.

20. The fuse according to claim 17 wherein the voltage determined by a current through said pass transistor comprises a current from a lateral collector of said pass transistor.

* * * * *